United States Patent
Thom

(10) Patent No.: US 6,517,908 B1
(45) Date of Patent: Feb. 11, 2003

(54) METHOD FOR MAKING A TEST WAFER FROM A SUBSTRATE

(75) Inventor: Mark A. Thom, Madison, WI (US)

(73) Assignee: NEC Electronics, Inc., Santa Clara, CA (US)

( * ) Notice: Subject to any disclaimer, the term of this patent is extended or adjusted under 35 U.S.C. 154(b) by 0 days.

(21) Appl. No.: 09/480,276

(22) Filed: Jan. 10, 2000

(51) Int. Cl.[7] .............................. C23C 4/06; C23C 16/06
(52) U.S. Cl. ........................................ 427/456; 427/250
(58) Field of Search ................................. 427/456, 250

(56) References Cited

U.S. PATENT DOCUMENTS

| | | | |
|---|---|---|---|
| 5,097,630 A | 3/1992 | Maeda et al. | 51/50 |
| 5,599,746 A | 2/1997 | Lur et al. | 437/200 |
| 5,770,324 A | 6/1998 | Holmes et al. | 428/688 |
| 5,800,725 A | 9/1998 | Kato et al. | 216/88 |
| 5,853,840 A | 12/1998 | Saito et al. | 428/64.1 |
| 5,904,892 A | 5/1999 | Holmes | 264/650 |
| 5,965,278 A * | 10/1999 | Finley et al. | 428/641 |

OTHER PUBLICATIONS

Thermal Spraying: Practice, Theory, and Application, American Welding Society, Inc. 1985, pp. 9 and 42.*

* cited by examiner

Primary Examiner—Katherine A Bareford
(74) Attorney, Agent, or Firm—Campbell Stephenson Ascolese LLP

(57) ABSTRACT

Provided is a test wafer and a process for making the same that includes a plurality of peaks on a surface thereof that have a cross-section sufficient to reduce the stress of a refractory metal layer deposited thereon. The present invention is based upon the discovery that by fracturing a refractory metal layer on a test wafer reduces the stress to which the test wafer is subjected. The test includes a substrate having a surface with a plurality of peaks and troughs formed therein defining a roughness. Typically, the roughness Ra is in the range of 500 to 1200 micrometers.

5 Claims, 4 Drawing Sheets

METHOD FOR MAKING A TEST WAFER FROM A SUBSTRATE

FIELD OF THE INVENTION

The present invention relates to semiconductor processing. More particularly, the present invention relates to a test wafer, for semiconductor processing apparatuses, and a method for fabricating the same.

BACKGROUND OF THE INVENTION

To decrease the cost associated with fabricating semiconductor circuits, test/dummy wafers have been implemented. Test wafers are intended to be used multiple times to test, inter alia, one or more of the various processes that occur during the fabrication of semiconductor circuits formed on a deposition wafer. Typical processes include formation of films on the wafers employing chemical vapor deposition (CVD), physical vapor deposition (e.g. sputtering [PVD]), etching and the like. A test wafer should, therefore, satisfy two important requirements. The test wafer should produce relatively few particulate contaminates and should be resistant to structural compromise when subjected to the aforementioned processes.

An exemplary test wafer may be formed from silicon carbide made by depositing silicon carbide on a graphite sheet using CVD techniques. The graphite sheet silicon carbide combination is burnt in an oxidizing atmosphere, thereby removing the graphite sheet to obtain a silicon carbide substrate. Thereafter, the silicon carbide substrate is subjected to machining to produce the desired test wafer. Alternatively, silicon carbide powder may be sintered or graphite may be converted into silicon carbide.

Various drawbacks with the aforementioned test wafers have been identified, such as long production time, short operational life, warpage of the test wafer, and contamination of a deposition system by the same.

To overcome these drawbacks U.S. Pat. No. 5,853,840 to Saito et al. discloses a test wafer for use in a process for thin film formation on a wafer, which is made without the use of metal. To that end, the test wafer is made from silicon carbide fabricated by reacting a glassy carbon with silicon or with a silicon-containing gas. Saito et al. also describes fabricating a substrate, as discussed above, from silicon carbide obtained by reacting a glassy carbon with silicon or with a silicon-containing gas may also form the test wafer. After formation of the substrate, a CVD deposition process is employed to deposit a silicon carbide layer onto the substrate. Although the forgoing test wafer is suitable for its intended purpose, the operational life of the same is limited when employed to test deposition chemistries for refractory metal films.

What is needed, therefore, is a test wafer, for a semiconductor processing system, that has an extended operational life when compared to the test wafer of the prior art, while minimizing the quantity of particulate contaminants introduced in the system.

SUMMARY OF THE INVENTION

Provided is a test wafer and a process for making the same that includes a plurality of peaks on a surface thereof that have a cross-section sufficient to reduce the stress of a refractory metal layer deposited thereon. The present invention is based upon the discovery that fracturing a refractory metal layer on a test wafer reduces the stress to which the test wafer is subjected. In this manner, the test wafer is provided with a longer operational life. The test includes a substrate having a surface with a plurality of peaks and troughs formed therein defining a roughness. Typically, the roughness Ra is in the range of 500 to 1200 micrometers. Although the wafer may be formed from any known material, it is typically formed from silicon-carbide. The surface of the wafer may be provided with the aforementioned roughness using conventional lithography techniques, such as masking and etching, to form the plurality of peaks and troughs. A subgroup of the peaks include sides forming an oblique angle with respect to a nominal profile of the surface. With this configuration, the peaks of the subgroup may fracture the refractory metal layer disposed thereon, resulting in a reduction in stress on the test wafer.

Alternatively, the roughness may be formed on the test wafer using aluminum arc spray or flame techniques. As a result, the test wafer would include a layer of aluminum in which the aforementioned peaks and troughs are formed, providing the roughness Ra is in the range of 500 to 1200 micrometers. Thus, the features on the surface of the test wafer, i.e., the peaks and troughs define a pattern that is typically, aperiodic.

DETAILED DESCRIPTION OF THE PRESENT INVENTION

Figure 1:
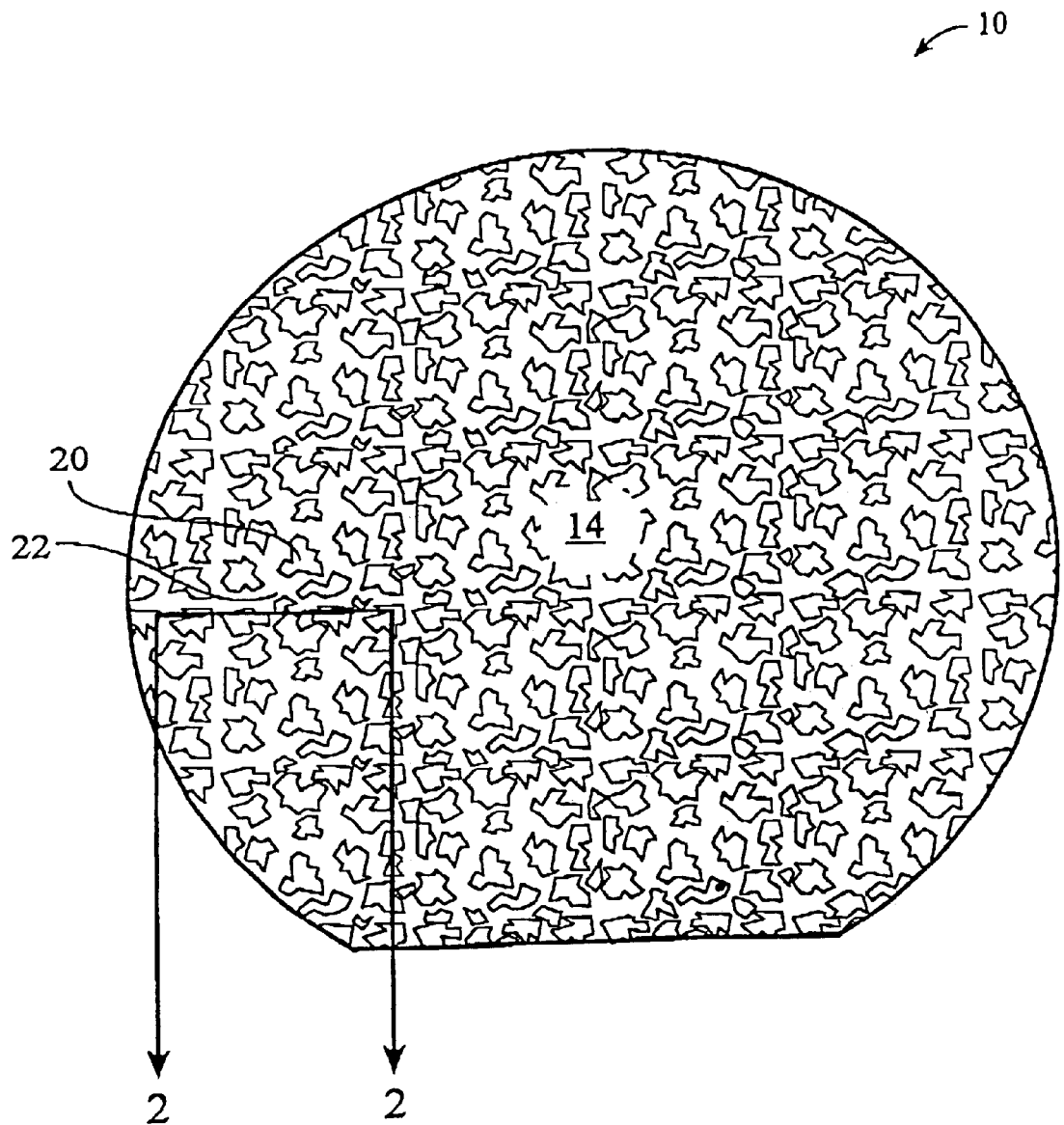
FIG. 1 is a top down view of a test wafer in accordance with the present invention.
Figure 2:
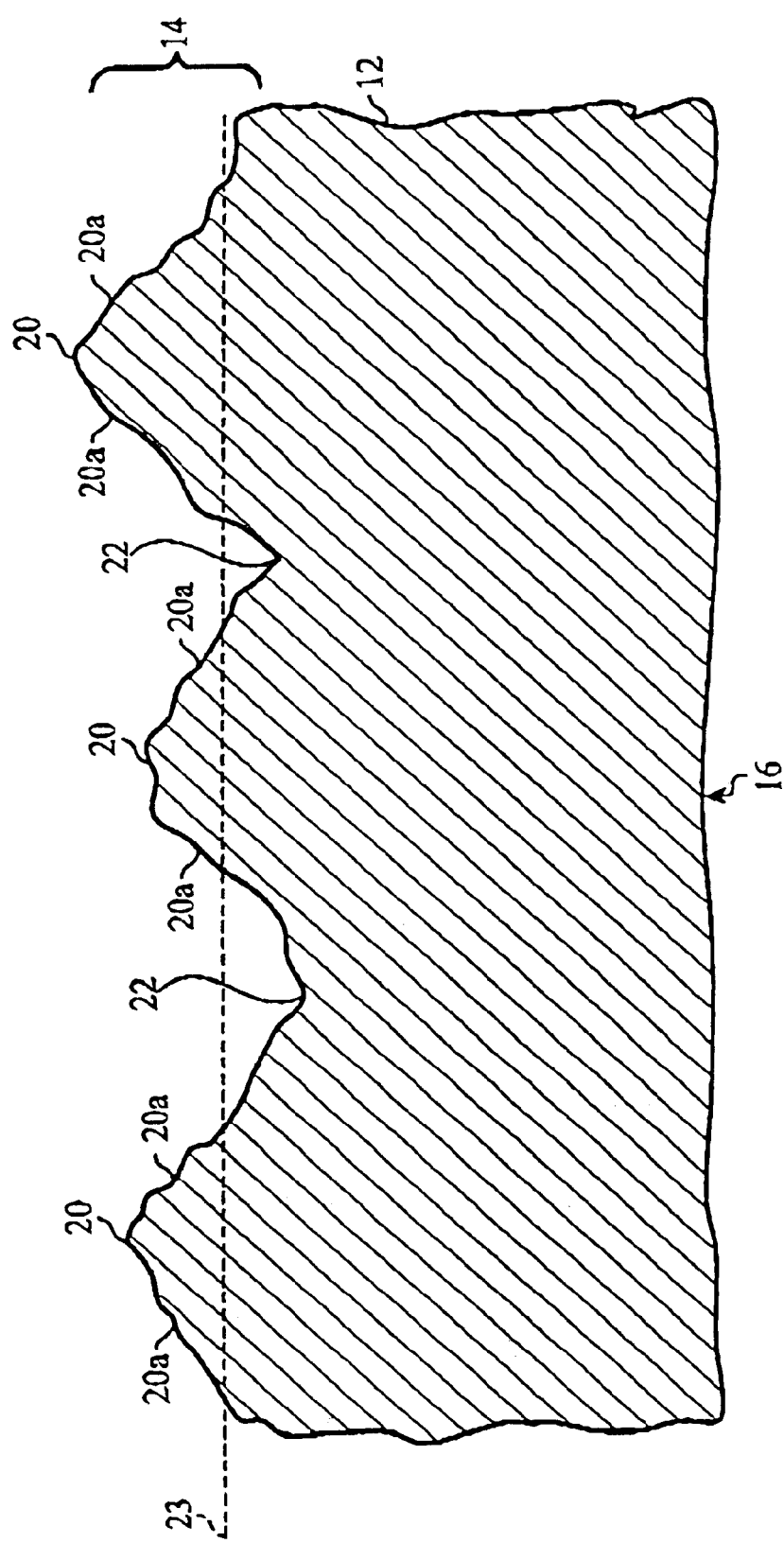
FIG. 2 is a cross-sectional view of the test wafer shown above in FIG. 1 taken along lines 2—2.

Referring to FIGS. 1 and 2, a test wafer 10 is formed from a substrate 12 that has two major surfaces disposed opposite to one another, shown as 14 and 16. The surface 14 includes a plurality of features such as peaks 20 and troughs 22. Although it is not necessary, the features typically cover the entire area defined by the surface 14. The substrate may be formed from any known material such as silicon. However, the test wafer is usually formed from a relative rigid compound, such as silicon-carbide to reduce the probability of structural compromise in when subjected to stress, discussed more fully below.

Specifically, it was found that the test wafer 10 would bow after repeated use, i.e., after multiple refractory metal layers (not shown) were deposited on the surface 14. It is believed that the bowing of the test wafer 10 resulted from the stress of the refractory metal layer (not shown) on the test wafer 10. It was discovered, however, that the stress of the refractory metal layer may be reduced sufficiently to increase the operational life of the test wafer 10 by fracturing the same. To that end, the surface 14 is provided with the plurality of peaks 20 and troughs 22.

Referring to FIG. 2, the surface has a nominal profile 23 associated therewith. The nominal profile 23, for purposes of the present invention, is defined as the surface contour that would be present were the surface 14 planarized. A subgroup of the peaks 20 each includes side surfaces 20a that extend therefrom toward the troughs 22, forming oblique angles with respect to the nominal profile. In this manner, the peaks 20 and troughs 22 define a roughness Ra in the range of 500 to 1200 micrometers, inclusive.

Figure 3:
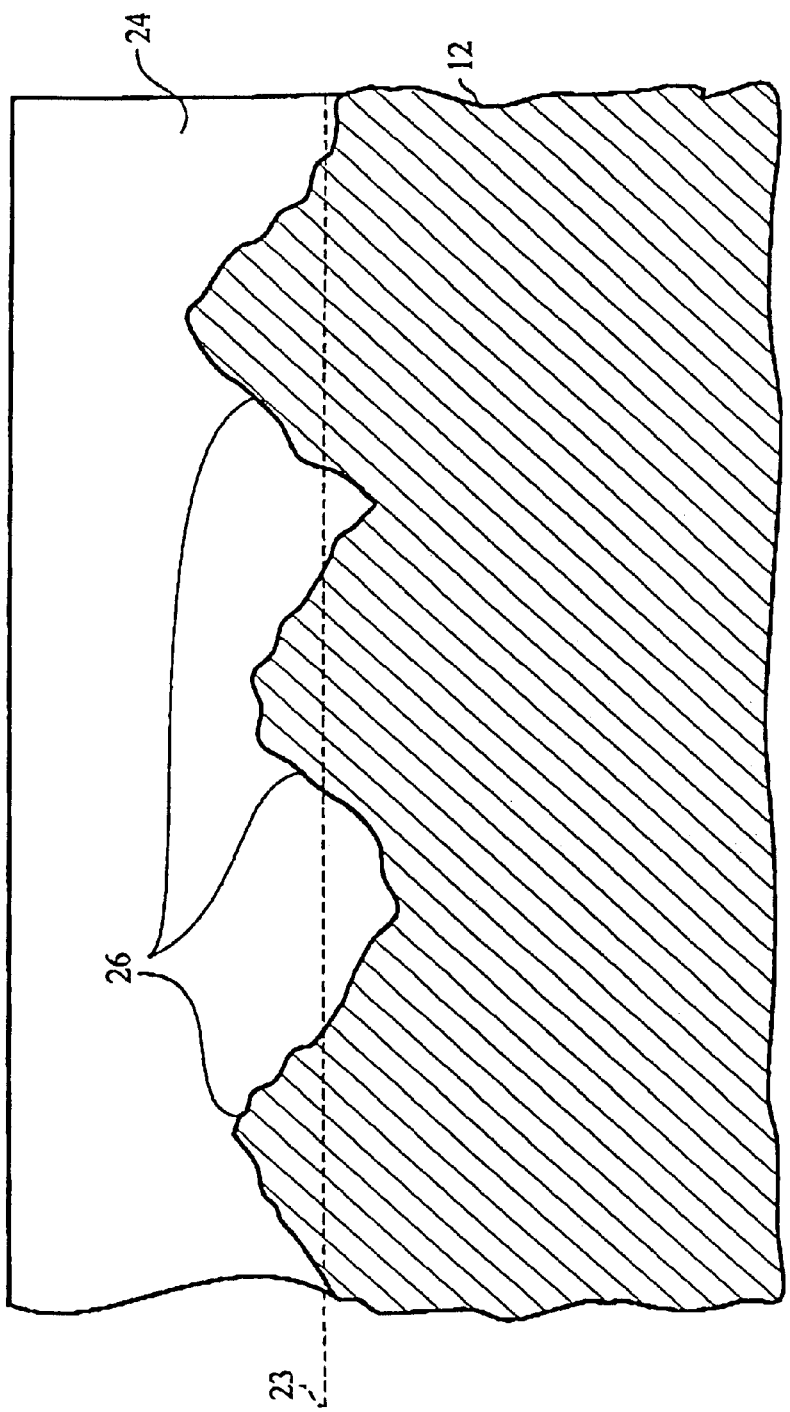
FIG. 3 is a cross-sectional view of the test wafer shown above in FIG. 2 including a refractory metal layer.

Referring to FIGS. 2 and 3, a refractory metal layer 24, such as titanium or tungsten is deposited on the surface 14 using standard chemical vapor deposition (CVD) processes. The refractory metal layer 24 subjects the substrate 12 to a tensile stress along a direction parallel to the plane in which the surface 14 lies. The peaks 20 and troughs 22, however, reduce the stress applied to the surface 14 by fracturing the refractory metal layer 24 at several regions 26 positioned proximate to the peaks 20. With this configuration, the test wafer has an extended operational life. More particularly, upwards of ten times the amount of refractory metal layers may be disposed on the surface 14 with the peaks 20 and troughs 22 present compared to a test wafer having a planarized surface.

The peaks 20 and troughs 22 may be formed using standard photolithography and etch techniques. Alternatively, the peaks 20 and troughs 22 may be formed employing either an aluminum arc spay or flame spray technique. As is well known in the semiconductor art, aluminum arc spray is a metallization process in which molten aluminum is spayed onto the surface of an object to be coated. In this case the object is the surface 14. The arc spray process employs 99% aluminum by feeding two aluminum wires into an arc gun. Electrical current is supplied to the arc gun and the resulting arc melts the wire, creating molten aluminum. A spray is produced by ejecting the molten aluminum from the arc gun using either compressed air or an inert gas. The flame spray technique is similar to the arc spray technique, differing in that an oxygen acetylene torch melts a single aluminum wire.

Using either the arc spray technique or the flame spray technique, the surface 14 may be formed with the peaks 20 and troughs 22, as described above. This provides a test wafer that produces relatively few contaminants while providing a substantial increase in operational life.

Figure 4:
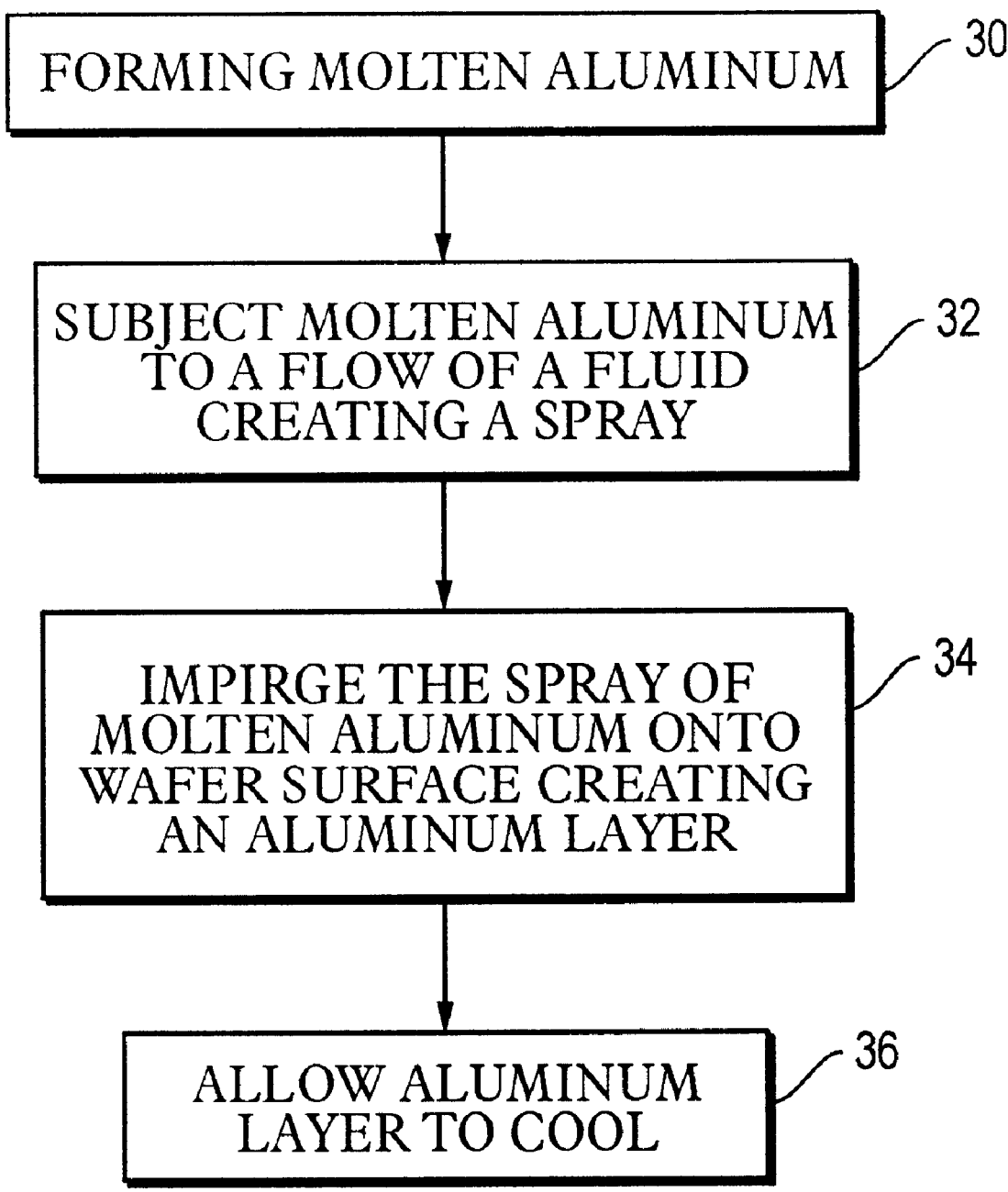
FIG. 4 is a flow diagram for fabricating the test wafer shown above in FIG. 1 in accordance with one embodiment of the present invention.

To that end, a method employed to form the test wafer 10 is shown in FIG. 4 as including forming molten aluminum by heating an aluminum wire at step 30. At step 32, the molten aluminum is subjected to a flow of a fluid producing a spray of molten aluminum. The fluid may be suitable fluid know in the semiconductor art, but is typically compressed air or an inert gas, such as argon. At step a 34, the spray of molten aluminum is made to impinge upon the surface 14 by scanning the spray over the surface 14. This allows any subportion of the area of the surface 14 to be covered with a layer of molten aluminum, including the entire area thereof. Thereafter, the layer of molten aluminum is allowed to cool, at step 36.

Although the foregoing has been described with respect to depositing an aluminum layer on a substrate it should be understood that any suitable material capable of forming the peaks and troughs as discussed above, may be employed. The breadth of the present invention should not, therefore, be construed based upon the foregoing exemplary embodiments. Rather, the breadth of the invention should be construed based upon the following claims, including the full scope of equivalents thereof.

What is claimed is:

1. A process for making a test wafer for semiconductor processing from a substrate, comprising:

forming molten aluminum;

are spraying or flame spraying said molten aluminum onto said substrate to form an aluminum layer having a texture;

forming a refractory metal layer on the textured aluminum layer using chemical vapor deposition.

2. The process as recited in claim 1 further including cooling said aluminum layer prior to forming the refractory metal layer.

3. The process as recited in claim 1 wherein said texture has a roughness Ra in the range of 500 to 1200 micrometers, inclusive.

4. The process as recited in claim 1 wherein spraying includes subjecting said molten aluminum to a flow of a gas to form an aluminum spray.

5. The process as recited in claim 4 wherein said gas is selected from the group consisting essentially of compressed air and an inert gas.

* * * * *